US007031407B1

(12) United States Patent
Ovadia et al.

(10) Patent No.: US 7,031,407 B1
(45) Date of Patent: Apr. 18, 2006

(54) APPARATUS AND METHOD FOR DECODING AND TRACE BACK OF CONVOLUTION CODES USING THE VITERBI DECODING ALGORITHM

(75) Inventors: Bat-Sheva Ovadia, Hod Hasharon (IL); Boaz Israeli, Beer-Sheva (IL)

(73) Assignee: Ceva D.S.P. Ltd., Herzlia Pituach (IL)

( * ) Notice: Subject to any disclaimer, the term of this patent is extended or adjusted under 35 U.S.C. 154(b) by 0 days.

(21) Appl. No.: 09/406,788

(22) Filed: Sep. 28, 1999

Related U.S. Application Data

(60) Provisional application No. 60/102,053, filed on Sep. 28, 1998.

(51) Int. Cl.
*H03D 1/00* (2006.01)
(52) U.S. Cl. ...................................... 375/341
(58) Field of Classification Search ................ 395/341; 375/341, 340, 316
See application file for complete search history.

(56) References Cited

U.S. PATENT DOCUMENTS

| 5,715,470 | A | * | 2/1998 | Asano et al. ................ 375/341 |
| 5,802,115 | A | * | 9/1998 | Meyer ......................... 375/341 |
| 5,987,490 | A | * | 11/1999 | Alidina et al. .............. 708/523 |
| 6,029,267 | A | * | 2/2000 | Simanapalli et al. ........ 714/795 |
| 6,084,925 | A | * | 7/2000 | Baek .......................... 375/341 |
| 2002/0010895 | A1 | * | 1/2002 | Mujtaba ..................... 714/795 |

OTHER PUBLICATIONS

Lou, H.L., "Implementing the Viterbi Algorithm", IEEE Signal Processing Magazine, Sep. 1995, pp. 42-52.
Texas Instruments TMS320C54X User's Guide, (3 / 15-17; 8 / 46-52; 8/ 64; and 12/ 47-50).

* cited by examiner

*Primary Examiner*—Kevin Burd
(74) *Attorney, Agent, or Firm*—Pearl Cohen Zedek Latzer LLP

(57) ABSTRACT

A system for generating and storing trace bits for Viterbi decoding of binary convolution codes includes at least one arithmetic logic unit (ALU) for determining the trace bits, and a first register and a second register for storing the trace bits. The first register stores a first half of a series of trace bits for N states in sequential order and the second register stores a second half of the series in sequential order. A binary convolution decoder having multiple stages each having N states includes at least one arithmetic logic unit (ALU), a first register and a second register, and a storage device. The at least one ALU determines trace bits for each of the N states for each of the multiple stages. The first and second registers store trace bits of at least a portion of one stage. The storage device has memory cells. For each of the multiple stages, a group of at least one memory cell stores the N trace bits in sequential order. The system also includes means for tracing back, stage by stage, through the memory cells using the trace bits. Each of the memory cells has a length of at least N bits and the means for tracing back is operative to trace back in as few as two cycles per stage.

17 Claims, 14 Drawing Sheets

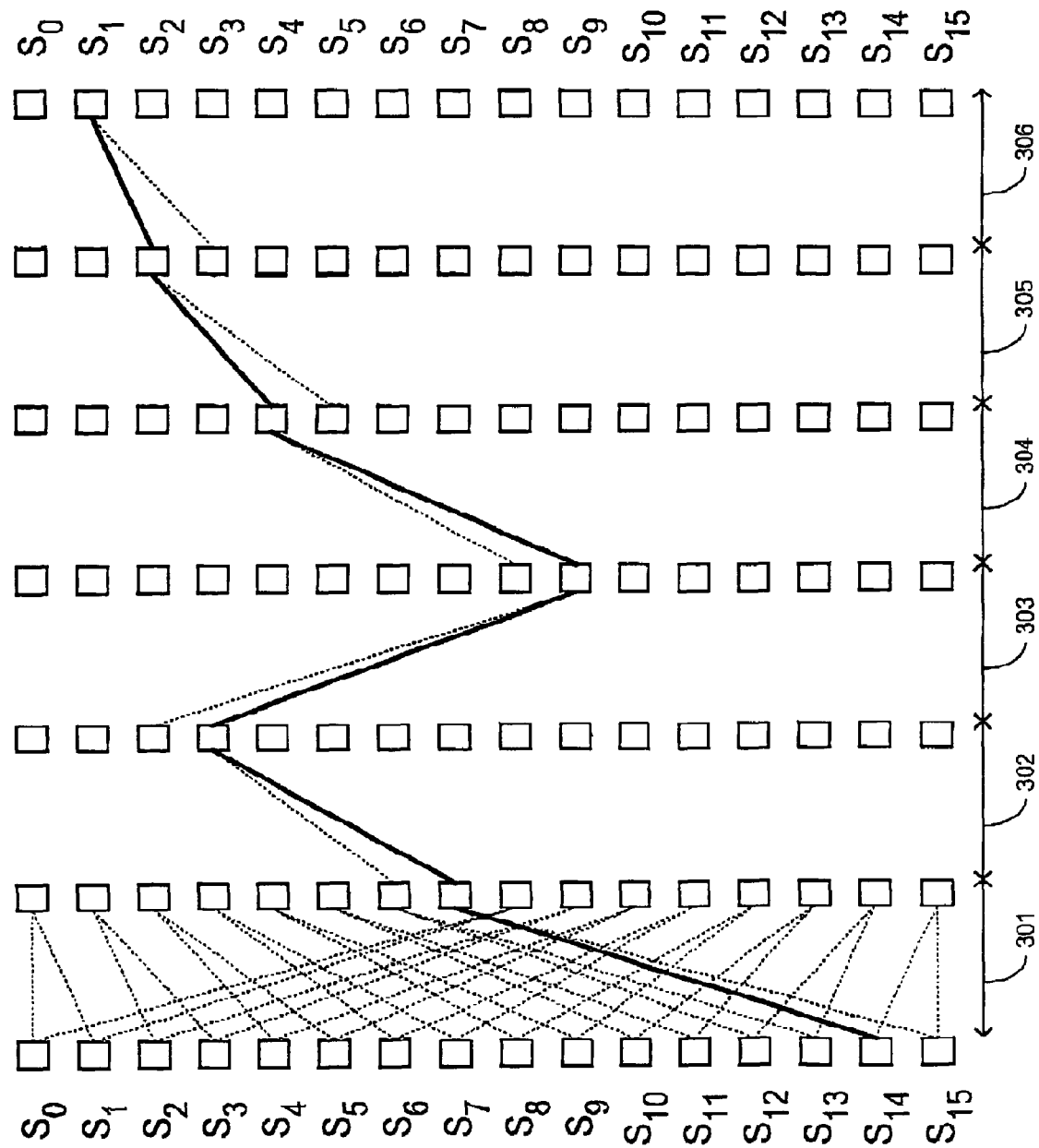

FIG. 5A
FIG. 5B
FIG. 5C

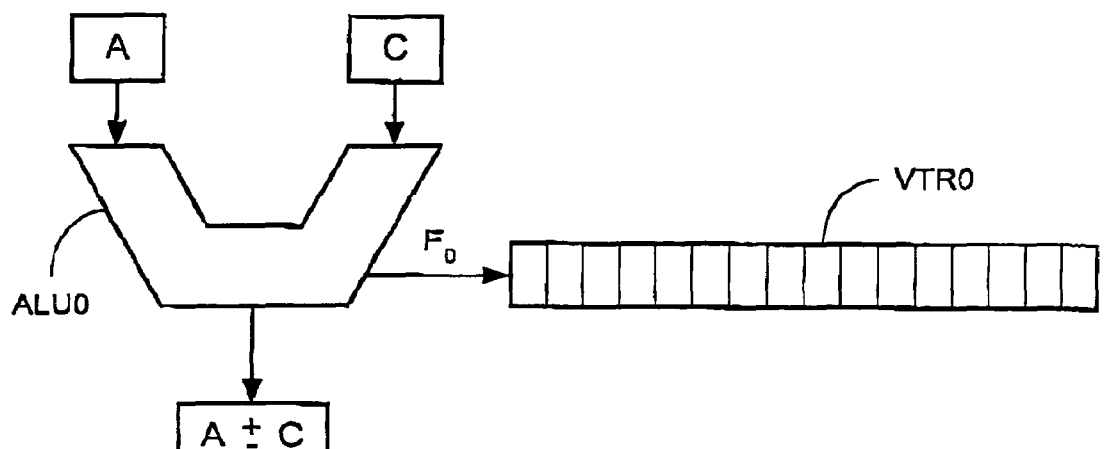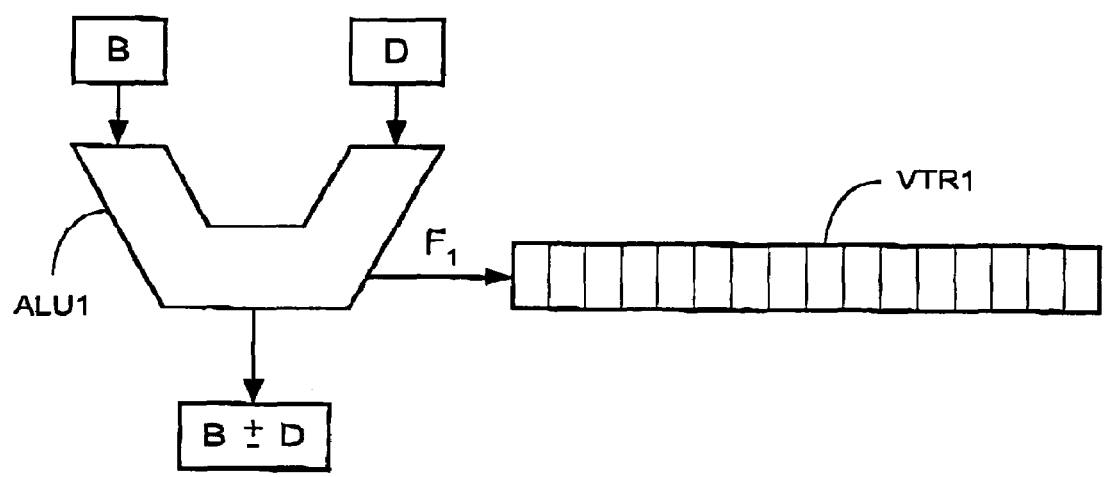
FIG. 6

FIG. 9

VTR0: TBIT $S_0$, TBIT $S_1$, TBIT $S_2$, TBIT $S_3$, TBIT $S_4$, TBIT $S_5$, TBIT $S_6$, TBIT $S_7$, TBIT $S_8$, TBIT $S_9$, TBIT $S_{10}$, TBIT $S_{11}$, TBIT $S_{12}$, TBIT $S_{13}$, TBIT $S_{14}$, TBIT $S_{15}$

BIT 0, BIT 1, BIT 2, BIT 3, BIT 4, BIT 5, BIT 6, BIT 7, BIT 8, BIT 9, BIT 10, BIT 11, BIT 12, BIT 13, BIT 14, BIT 15

VTR1: TBIT $S_{16}$, TBIT $S_{17}$, TBIT $S_{18}$, TBIT $S_{19}$, TBIT $S_{20}$, TBIT $S_{21}$, TBIT $S_{22}$, TBIT $S_{23}$, TBIT $S_{24}$, TBIT $S_{25}$, TBIT $S_{26}$, TBIT $S_{27}$, TBIT $S_{28}$, TBIT $S_{29}$, TBIT $S_{30}$, TBIT $S_{31}$

FIG. 11

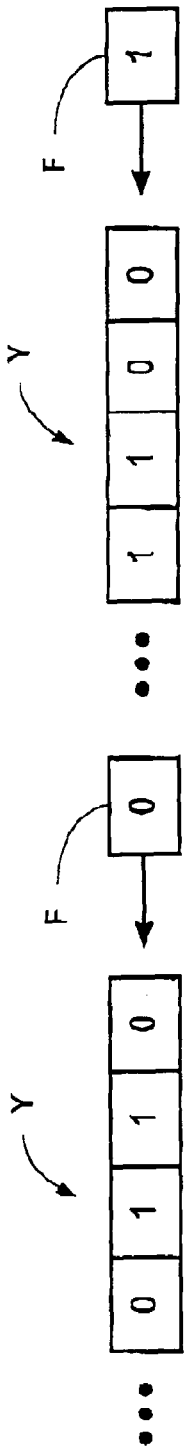
FIG. 14
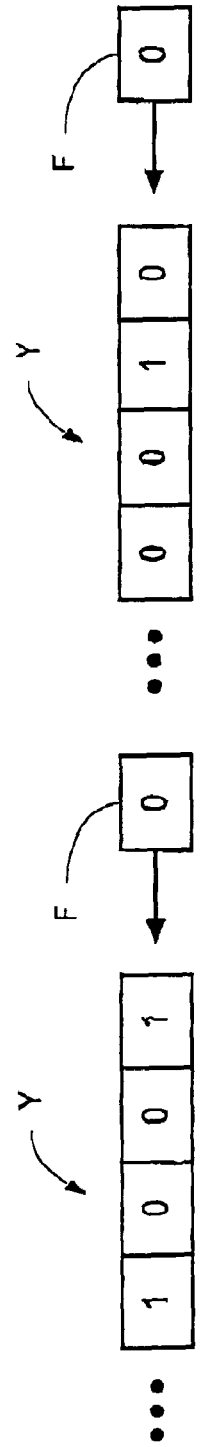
FIG. 15A
FIG. 15B
FIG. 15C
FIG. 15D

APPARATUS AND METHOD FOR DECODING AND TRACE BACK OF CONVOLUTION CODES USING THE VITERBI DECODING ALGORITHM

This application claims the benefit of provisional application 60/102,053 filed Sep. 28, 1998.

FIELD OF THE INVENTION

The present invention relates to Viterbi decoding.

BACKGROUND OF THE INVENTION

In a communication system having a high bit error rate (BER), received data can differ greatly from the transmitted data. The transmitted data is encoded with an error correction code so that errors in the received data can be corrected. The received data must then be decoded in order to reconstruct the transmitted data.

Convolution codes are a type of error correction code, which is widely used in telecommunications. As is known in the art, there are various methods for decoding convolution codes, one of which is the Viterbi decoding algorithm.

A plurality of states is defined for the convolution encoder/decoder. The most common binary convolution codes have $2^{K-1}$ states, where the constraint length K is for example, 5, 6, 7 or 9, as in global system for mobile communication (GSM) and code division multiple access (CDMA). Each of the $2^{K-1}$ states is an estimation of the K previous bits of the received data.

As is known in the art, Viterbi decoding of binary convolution codes can be represented by a trellis diagram. The trellis diagram is composed of "butterfly" structures, and one such structure is shown in FIG. 1A, to which reference is now made. The trellis diagram illustrates all possible transitions from one state to another. As shown in the butterfly structure, transitions from the old states $S_{2J}$ or $S_{2J+1}$ can be only to one of the new states $S_J$ and $S_{J+N/2}$. This is true for all integral values of a state index J from 0 to N/2−1, where N is the total number of states.

An indication of which transition was made is necessary in order to know whether a new state $S_J$ came from old state $S_{2J}$ or $S_{2J+1}$. One possible indication would be to store the number of the state, 2J or 2J+1, in memory. Another possible indication, which requires less space in memory, would be to associate a trace bit with each of the possible transitions. In the present example, a "0" trace bit is used when the original state is $S_{2J}$ and a "1" trace bit is used when the original state is $S_{2J+1}$. An alternative indication could use a "0" trace bit when the original state is $S_{2J}$ and a "1" trace bit when the original state $S_{2J+1}$.

FIG. 1B, to which reference is now additionally made, shows a portion of the trellis diagram, as is known in the art. In order to simplify the drawing, the trellis diagram is for 16-state binary convolution codes (i.e. a constraint length K of 5). $S_0$ can be reached from either $S_0$ or $S_1$, $S_8$ can be reached from either $S_0$ or $S_1$, $S_1$ can be reached from either $S_2$ or $S_3$ and $S_9$ can be reached from either $S_2$ or $S_3$.

As shown in FIG. 1A, the branches of the trellis diagram are assigned branch metric values, $M_1$ for the transition from $S_{2J}$ to $S_J$, $M_2$ for the transition from $S_{2J+1}$ to $S_J$, $M_3$ for the transition from $S_{2J}$ to $S_{J+N/2}$, and $M_4$ for the transition from $S_{2J+1}$ to $S_{J+N/2}$. The branch metric values are dependent upon the symbols in the received data. Techniques for calculating branch metrics are well known in the art and will not be discussed further. H.-L. Lou, "Implementing the Viterbi Algorithm", IEEE Signal Processing Magazine, September 1995, pp. 42–52, describes a technique for calculating branch metrics.

Moreover, a weight $W(S_J)$ is associated with each state $S_J$. The weight of a particular new state, also known as its path metric, is calculated according to the following equations:

$$W(\text{new } S_J) = \max\{W(\text{old } S_{2J}) + M_1, W(\text{old } S_{2J+1}) + M_2\}$$
and
$$W(\text{new } S_{J+N/2}) = \max\{W(\text{old } S_{2J}) + M_3, W(\text{old } S_{2J+1}) + M_4\}.$$

As is well known in the art, an alternative framework for calculating the weight of each state, in which weights and branch metrics are logarithmic values, uses the following equations:

$$W(\text{new } S_J) = \min\{W(\text{old } S_{2J}) + M_1, W(\text{old } S_{2J+1}) + M_2\}$$
and
$$W(\text{new } S_{J+N/2}) = \min\{W(\text{old } S_{2J}) + M_3, W(\text{old } S_{2J+1}) + M_4\}.$$

The calculation is called an "add-compare-select" (ACS) operation, because the steps are: add the appropriate branch metric value ($M_1$, $M_2$, $M_3$ or $M_4$) to the weight ($W(\text{old } S_{2J})$ and $W(\text{old } S_{2J+1})$) of the old states from which the new state could have been reached, compare the sums, and select the maximum or minimum sum.

FIG. 1B shows the example of the branch metric values $M_1$, $M_2$, $M_3$ and $M_4$ as 0.25, 0.1, 0.3 and 0.15, respectively, and the initial weights of old $S_0$ and old $S_1$ as 0.3 and 0.4, respectively. The weights of new $S_0$ and new $S_8$ after one step of encoding are 0.55 and 0.7, respectively, according to the following calculations:

$$W(\text{new } S_0) = \max\{0.3 + 0.25, 0.4 + 0.1\} = 0.55$$

$$W(\text{new } S_8) = \max\{0.3 + 0.15, 0.4 + 0.3\} = 0.7$$

According to the Viterbi decoding algorithm, for each source symbol received, there is a transition between states, the set of transitions and states defining a "stage". The weights of all $2^{K-1}$ states in the stage are calculated, and for each of the states, the transition resulting in the maximum weight (or minimum weight, according to the alternative framework mentioned hereinabove) for that state is identified, and the associated trace bit is stored. The trace bit associated with the transition is determined during the "select" step of the "add-compare-select" operation when calculating the weights.

In the single transition of FIG. 1B, the new state $S_8$ has a weight of 0.7. Due to the butterfly structure of the trellis diagram, $S_8$ could have been reached from either $S_0$ or $S_1$. $S_8$ was assigned the maximum weight of 0.7 due to the transition from $S_1$, which is an $S_{2J+1}$ state, and therefore the trace bit associated with this transition is 1.

When using the Viterbi decoding algorithm, the trace bits are used to trace back the optimal path from a "final" state to an "original" state, the optimal path and the original state enabling reconstruction of the transmitted data. According to one method, one can wait until all of the transmitted symbols have been received in order to begin the trace back. However, due to the limitations of memory space, an alternative method is to begin the decoding procedure when the memory is full, which occurs before all of the transmitted symbols have been received. In the first case, the transmitted symbols generally have a tail of known symbols attached to the end, typically "0" symbols, and therefore $S_0$ is always chosen as the final state from which the trace back decoding is performed. In the second case, the state from which the trace back decoding is performed is the state having the maximum weight (or minimum weight, according to the alternative framework mentioned hereinabove).

In this specification and claims, the term "final state" is used to mean the state from which the trace back decoding begins, whether it is due to a tail or due to memory being full.

Reference is now made to FIG. 2, which is a schematic illustration of an arrangement of trace bits for 16-state binary convolution codes in a single 16-bit register 200, as is known in the art. Register 200 can store a trace bit for each of 16 states. Since the weights for states $S_J$ and $S_{J+8}$ are calculated from the same butterfly, the order in which the trace bits are determined is $S_0$ and $S_8$, $S_1$ and $S_9$, $S_2$ and $S_{10}$, etc. The digital signal processor (DSP) TMS320C54x from Texas Instruments Incorporated of Dallas, Tex. USA arranges the trace bits for $S_J$ and $S_{J+8}$ next to each other as shown in register 200. This is described in *TMS320C54x User's Guide* 1995, pp. 3–16, 3–17, and 12–47 to 12–50. The DSP TMS320C54x retains this interleaved arrangement of trace bits when moving the trace bits from the register 200 to a memory cell (not shown).

Reference is now made to FIG. 3, which is an example of a trellis diagram for 16-state binary convolution codes, as is known in the art. For simplicity, the trellis diagram has only 6 stages, involving 6 transitions between states. Reference is made additionally to FIG. 4, which is a schematic illustration of exemplary trace bits for the transitions shown in the trellis diagram of FIG. 3, the trace bits arranged in memory unit 400 according to the arrangement described in FIG. 2. As clarified in the description that follows, the rows of memory unit 400 are filled with trace bits. However, in order to simplify FIG. 4, only those trace bits that are essential to the trace back procedure are shown.

In FIG. 3, each of the $2^{K-1}$ initial states has an initial weight. When the first symbol is received, the weights of all possible states in stage 301 are calculated. Based upon the selections made during the ACS operations of the weight calculations, a trace bit for each state of stage 301 is stored in row 401 of memory unit 400. When the next symbol is received, the weights of all possible states in stage 302 are calculated, and a trace bit for each state of stage 302 is stored in row 402 of memory unit 400. This process continues until the final symbol is received or the memory is full. In order to determine the optimal path in the full-memory case, the state of stage 306 having the maximum weight (or minimum weight, according to the alternative framework mentioned hereinabove) is identified, and in the present example, it is $S_1$.

Trace back decoding based on the trace bits is performed from $S_1$ of stage 306. $S_1$ of stage 306 was reached from either $S_2$ of stage 305 or $S_3$ of stage 305. The trace bit stored for $S_1$ in row 406 is 0, so $S_1$ was reached from $S_2$. The trace bit stored for $S_2$ in row 405 is 0, so $S_2$ was reached from $S_4$ of stage 304. The heavy solid lines indicate the complete trace back of states, and the original state is $S_{14}$. From knowledge of the original state and the collected trace bits of the optimal path, the transmitted data can be reconstructed.

The way in which the trace bits are stored for each of the states and the associated trace back instruction affects the speed of the trace back decoding. The interleaved arrangement of trace bits shown in FIG. 2 makes the trace back decoding rather complex. The DSP TMS320C54x achieves a cycle rate of 6 cycles of trace back for the specific case of a 16-bit register and 16-state binary convolution codes.

SUMMARY OF THE INVENTION

There is provided in accordance with a preferred embodiment of the present invention a system for generating and storing trace bits for Viterbi decoding of binary convolution codes. The system includes at least one arithmetic logic unit (ALU) for determining the trace bits, and a first register and a second register for storing the trace bits.

Moreover, in accordance with a preferred embodiment of the present invention, the first register stores a first half of a series of trace bits for N states in sequential order and the second register stores a second half of the series in sequential order.

Furthermore, in accordance with a preferred embodiment of the present invention, the first half includes trace bits for states 0 to N/2−1 and the second half includes trace bits for states N/2 to N−1.

Additionally, in accordance with a preferred embodiment of the present invention, the at least one ALU is a first ALU and a second ALU, the first register stores the trace bits determined by the first ALU, and the second register stores the trace bits determined by the second ALU. In an alternative preferred embodiment, the at least one ALU is one ALU operating in split mode.

Moreover, in accordance with a preferred embodiment of the present invention, the first register and the second register are shift registers. In an alternative preferred embodiment, the system further includes at least one barrel shifter between the first register and one of the at least one ALU and between the second register and one of the at least one ALU.

Furthermore, in accordance with a preferred embodiment of the present invention, the system further includes a storage device having memory cells. A group of at least one memory cell stores the trace bits in sequential order.

Moreover, in accordance with a preferred embodiment of the present invention, the group stores the trace bits for a stage.

Furthermore, in accordance with a preferred embodiment of the present invention, the group includes one memory cell. Additionally, the system further includes means for packing the first half of the series of trace bits and the second half of the series of trace bits into the one memory cell so that the trace bits are packed sequentially in the memory cell.

Moreover, in accordance with a preferred embodiment of the present invention, the system further includes a storage device having groups of P memory cells. P being a power of 2 and P having a value of at least 2, the memory cells storing the trace bits in sequential order. In each of the groups, memory cells 0 to P/2−1 jointly store the first half of the series of trace bits and memory cells P/2 to P−1 jointly store the second half of the series.

Additionally, in accordance with a preferred embodiment of the present invention, P is 2, 4, 8, 16, 32 or 64.

There is also provided in accordance with a preferred embodiment of the present invention a binary convolution decoder having multiple stages each having N states. The decoder includes at least one arithmetic logic unit (ALU), a first register and a second register, and a storage device. The at least one ALU determines trace bits for each of the N states for each of the multiple stages. The first and second registers store trace bits of at least a portion of one stage. The storage device has memory cells. For each of the multiple stages, a group of at least one memory cell stores the N trace bits in sequential order. The system also includes means for tracing back, stage by stage, through the memory cells using the trace bits.

Moreover, in accordance with a preferred embodiment of the present invention, each of the memory cells has a length of at least N bits and the means for tracing back is operative to trace back in as few as two cycles per stage. Preferably, N is 16 or 32.

Furthermore, in accordance with a preferred embodiment of the present invention, the decoder further includes a trace back register whose L+P−1 least significant bits indicate the location in the group of a bit whose trace bit is to be saved into the least significant bit of the register after the register is shifted right one bit, the location including the bit number given by the L least significant bits of the register and the memory cell whose number in the group is given by the value in the P−1 bits of the register immediately to the left of the L least significant bits.

There is also provided in accordance with a preferred embodiment of the present invention a method for testing the value of a bit in a single instruction for a processor. The method includes the step of testing the value of the bit in the memory cell whose bit number is given by the L least significant bits of a register, regardless of the content of the other bits of the register. L is the integer part of the logarithm to base 2 of the length of the memory cell.

Moreover, in accordance with a preferred embodiment of the present invention, the step of testing includes the steps of setting a flag to 1 if the value is 1 and setting a flag to 0 if the value is 0.

Alternatively, in accordance with a preferred embodiment of the present invention, the step of testing includes the steps of setting a flag to 0 if the value is 1 and setting a flag to 1 if the value is 0.

There are also provided methods directed to the operation of the system and the decoder of the present invention, described hereinabove.

BRIEF DESCRIPTION OF THE DRAWINGS

The present invention will be understood and appreciated more fully from the following detailed description taken in conjunction with the appended drawings in which:

FIGS. 5A, 5B and 5C are schematic illustrations of an arrangement of trace bits for 16-state binary convolution codes in two 16-bit registers, according to a preferred embodiment of the present invention;

FIG. 6 is a schematic illustration of a hardware component architecture for calculating and storing trace bits, according to a preferred embodiment of the present invention;

FIG. 9 is a schematic illustration of an arrangement of trace bits for 32-state binary convolution codes in two 16-bit registers, according to a preferred embodiment of the present invention;

FIG. 11 is a schematic illustration of 16-bit memory cells containing two stages of trace bits for 64-state binary convolution codes, each stage occupying a group of four 16-bit memory cells, according to a preferred embodiment of the present invention;

FIG. 14 is an arrangement of exemplary trace bits in 16-bit memory cells for 16-state binary convolution codes, according to a preferred embodiment of the present invention;

FIGS. 15A, 16B, 16C and 15D are schematic illustrations of the register Y and the flag F referred to by the method of FIG. 12, demonstrating the trace back decoding of the exemplary trace bits of FIG. 13, according to a preferred embodiment of the present invention;

FIG. 16A is a schematic illustration of two 16-bit memory cells containing trace bits for one stage of 32-state binary convolution codes, according to a preferred embodiment of the present invention;

FIG. 16B is a schematic illustration of a 32-bit register Z to which the contents of the memory cells of FIG. 16A have been copied, so that the trace bits in register Z are ordered sequentially, according to a preferred embodiment of the present invention; and FIG. 16C is a schematic illustration of a register Y containing trace back information, according to a preferred embodiment of the present invention.

DETAILED DESCRIPTION OF THE PRESENT INVENTION

Figure 1A:
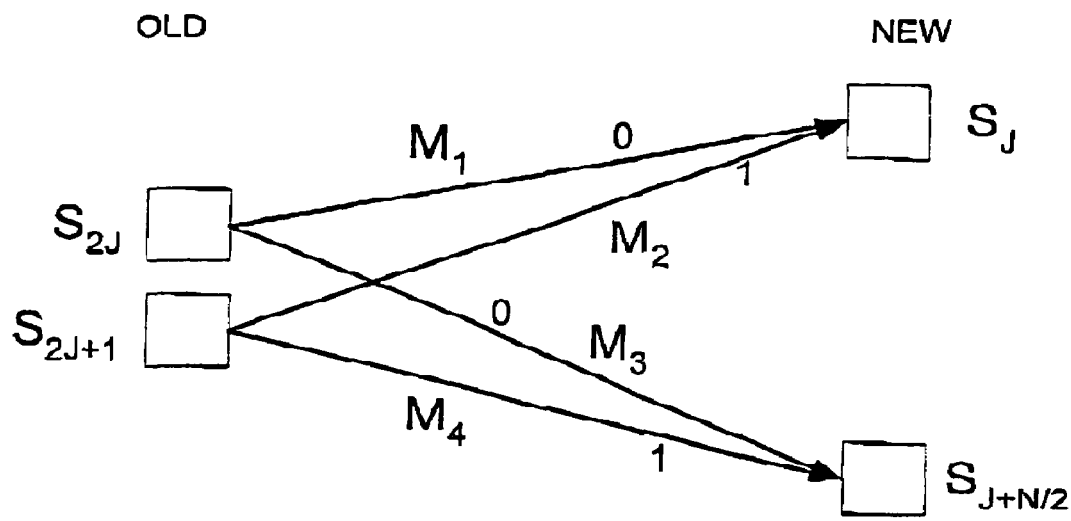
FIG. 1A is a schematic illustration of the "butterfly" structure showing two add-compare-select operations, as is known in the art.
Figure 1B:
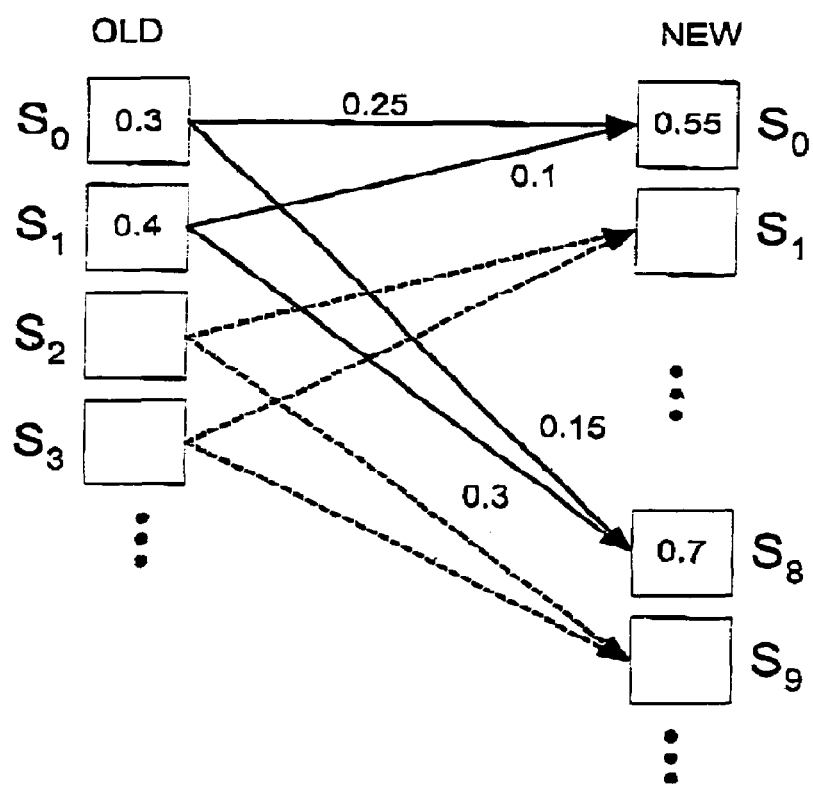
FIG. 1B is a schematic illustration of a portion of the trellis diagram for 16-state binary convolution codes, as is known in the art.
Figure 2:
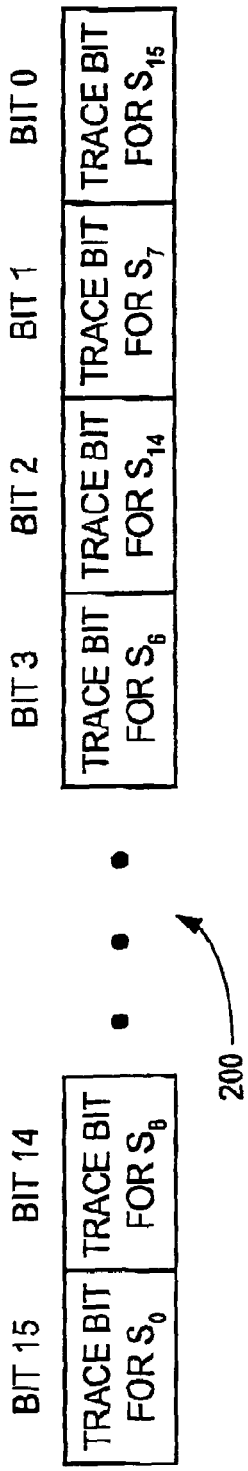
FIG. 2 is a schematic illustration of an arrangement of trace bits for 16-state binary convolution codes in a single 16-bit register, as is known in the FIG. 3 is an example of a trellis diagram for 16-state binary convolution codes, as is known in the art.
Figure 4:
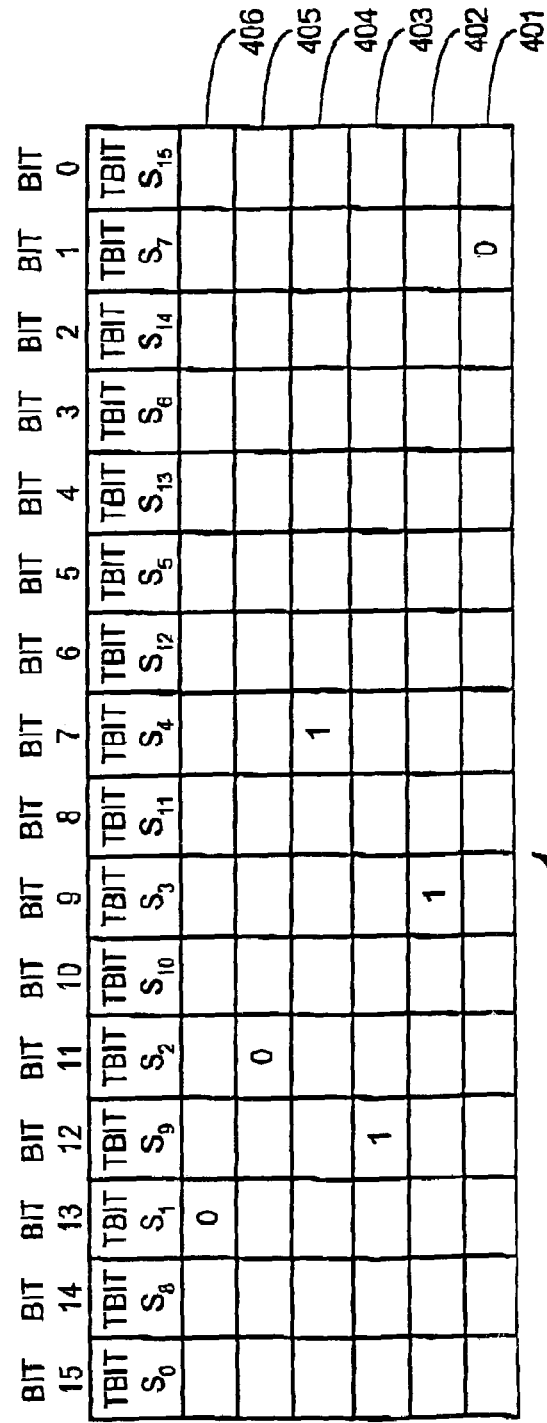
FIG. 4 is a schematic illustration of exemplary trace bits for the transitions shown in the trellis diagram of FIG. 3, the trace bits arranged in memory unit 400 according to the arrangement described in FIG. 2.

The present invention provides a novel apparatus and method for decoding and trace back of binary convolution codes using the Viterbi decoding algorithm. The present invention provides an apparatus and method including the use of two registers for storing trace bits. The present invention also provides an apparatus and method having a novel arrangement of trace bits in registers and in memory. The present invention also provides an apparatus and method for trace back in fewer cycles than the prior art. The present invention also provides a novel instruction for trace back.

Figures 5A, 5B, 5C:
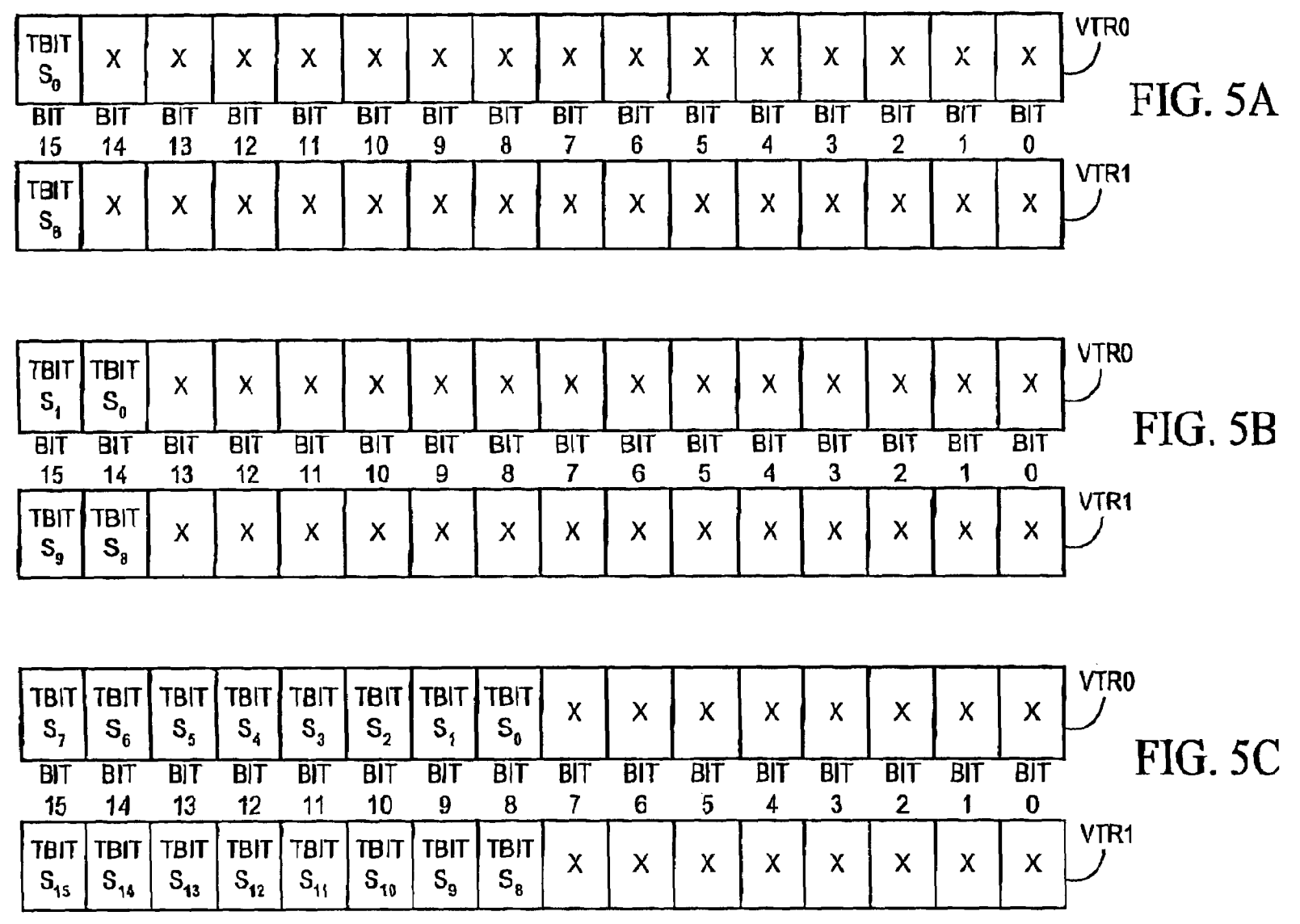

Reference is now made to FIGS. 5A, 5B and 5C, which are schematic illustrations of an arrangement of trace bits are for 16-state binary convolution codes (i.e. a constraint length K of 5) in two 16-bit registers, referenced VTR0 and VTR1, according to a preferred embodiment of the present invention.

Registers VTR0 and VTR1 are filled in the following manner. The first butterfly calculation yields trace bits for $S_0$ and $S_8$. As shown in FIG. 5A, the trace bit for $S_0$ is stored in the highest bit (bit 15) of register VTR0, and the trace bit for $S_8$ is stored in highest bit (bit 15) of register VTR1. The second butterfly calculation yields trace bits for $S_1$ and $S_8$. As shown in FIG. 5B, registers VTR0 and VTR1 are shifted to the right, moving the trace bits for $S_0$ and $S_8$ to the next-highest bits (bit 14) of registers VTR0 and VTR1, respectively. The trace bits for $S_1$ and $S_9$ are then stored in the highest bits (bit 15) of registers VTR0 and VTR1, respectively. This process of calculating trace bits one butterfly at a time, shifting registers VTR0 and VTR1 and storing the newly calculated trace bits in the highest bits of the registers, continues until all trace bits have been stored. As shown in FIG. 5C, the trace bits for $S_0$ through $S_7$ are stored sequentially in register VTR0, and the trace bits for $S_8$ through $S_{15}$ are stored sequentially in register VTR1. The apparatus and method of the present invention ignore bits marked with an "X".

According to an another preferred embodiment of the present invention, when the butterfly calculations are performed in reverse order, i.e. for S7 and S15 first, then the following manner for filling registers VTR0 and VTR1 yields the arrangement of trace bits shown in FIG. 5C. The process is to calculate trace bits, shift registers VTR0 and VTR1 to the left, and store the newly calculated trace bits in the lowest bits of the registers. These steps are repeated until all trace bits have been stored.

Reference is now made to FIG. 6, which is a schematic illustration of a hardware component architecture for calculating and storing trace bits, according to a preferred embodiment of the present invention. The hardware component may be, for example, part of a processor, part of a digital signal processor (DSP), or a stand-alone component. The component comprises two arithmetic logic units (ALUs) ALU0 and ALU1, connected to registers VTR0 and VTR1, respectively. ALU0 receives two inputs, A and C, and is capable of adding them, thereby producing the output A+C, and subtracting them, thereby producing the output A–C. Similarly ALU1 receives two inputs, B and D, and is capable of adding them, thereby producing the output B+D, and subtracting them, thereby producing the output B–D.

The "add-compare-select" (ACS) steps are:
1a) add $W(S_{2J})$ and $M_1$ to produce a first sum $T_0$,
1b) add $W(S_{2J})$ and $M_2$ to produce a second sum $T_1$,
1c) add $W(S_{2J+1})$ and $M_3$ to produce a third sum $R_0$,
1d) add $W(S_{2J+1})$ and $M_4$ to produce a fourth sum $R_1$,
2a) subtract the sums $T_0$ and $T_1$ to generate a flag $F_0$, and
2b) subtract the sums $R_0$ and $R_1$ to generate a flag $F_1$.

Steps 1a), 1b), 1c) and 1d) are performed by ALU0 and ALU1, in any combination. ALU0 must perform step 2a) so that the flag $F_0$ is stored to VTR0 and ALU1 must perform step 2b) so that the flag $F_1$ is stored to VTR1.

The differences calculated in steps 2a) and 2b) are either positive or negative numbers, and the sign bit has a value of 1 or 0 respectively. The sign bits are the flags $F_0$ and $F_1$ generated by the subtraction performed by ALU0, and ALU1, respectively. The trace bits in the flags $F_0$ and $F_1$, together with the new state weights, signify the "select" part of the "add-compare-select" operation.

Figure 7:
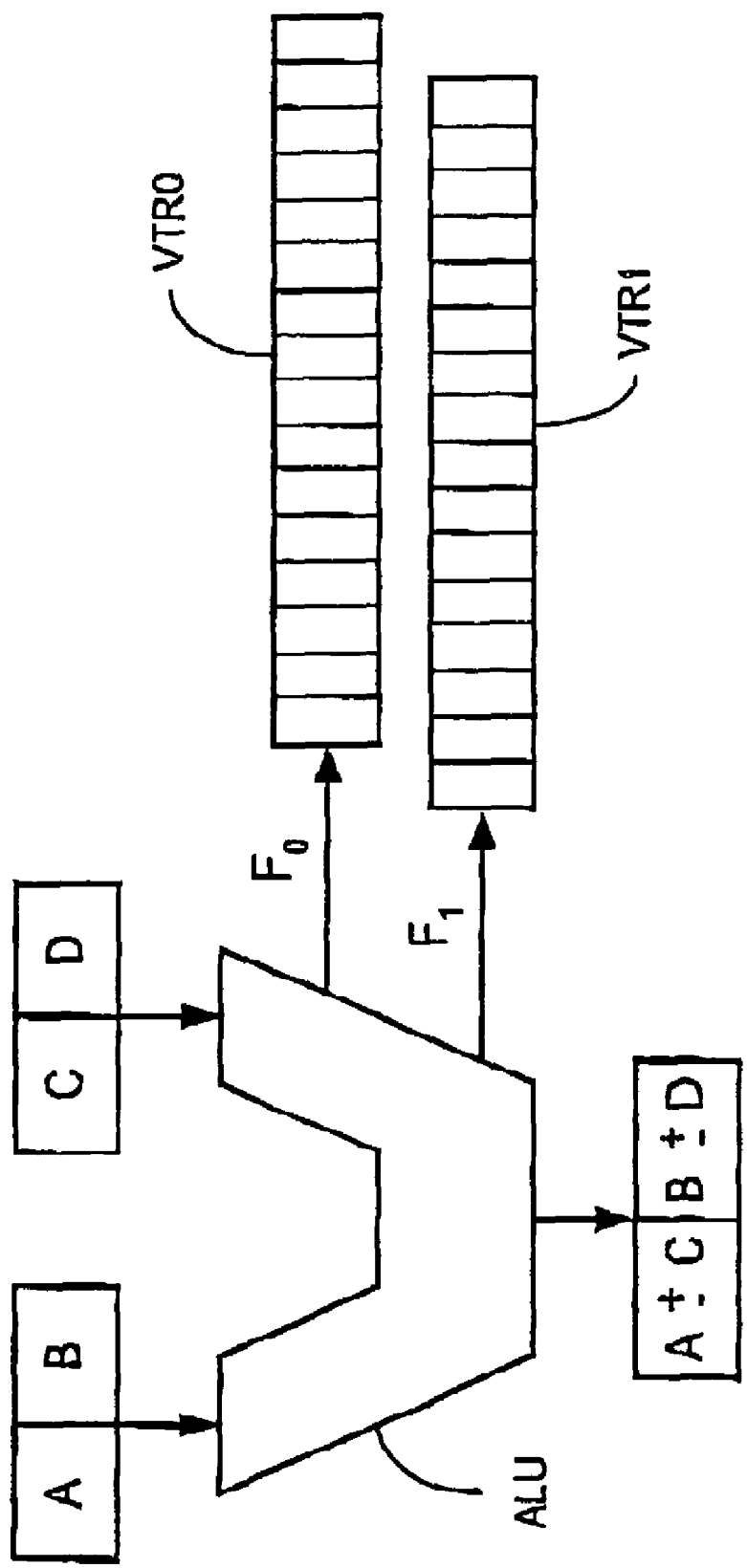
FIG. 7 is a schematic illustration of a hardware component architecture for calculating and storing trace bits, according to another preferred embodiment of the present invention.

Reference is now made to FIG. 7, which is a schematic illustration of a hardware component architecture for calculating and storing trace bits, according to another preferred embodiment of the present invention. The architecture is similar to that of FIG. 6, with the exception that a single arithmetic logic unit ALU that works in split mode is used. In this case, the flag $F_0$ is generated from the least significant word of the split ALU and the flag $F_1$ is generated from the most significant word of the split ALU.

It will be appreciated by persons skilled in the art that registers VTR0 and VTR1 may be shift registers, in which case flags $F_0$ and $F_1$ are stored directly to the highest bit of registers VTR0 and VTR1, respectively. Alternatively, registers VTR0 and VTR1 may be simple output registers, in which case the architectures of FIGS. 6 and 7 are modified to include at least one barrel shifter, which are known in the art, as an intermediary between flags $F_0$ and $F_1$ and registers VTR0 and VTR1.

Figure 8:
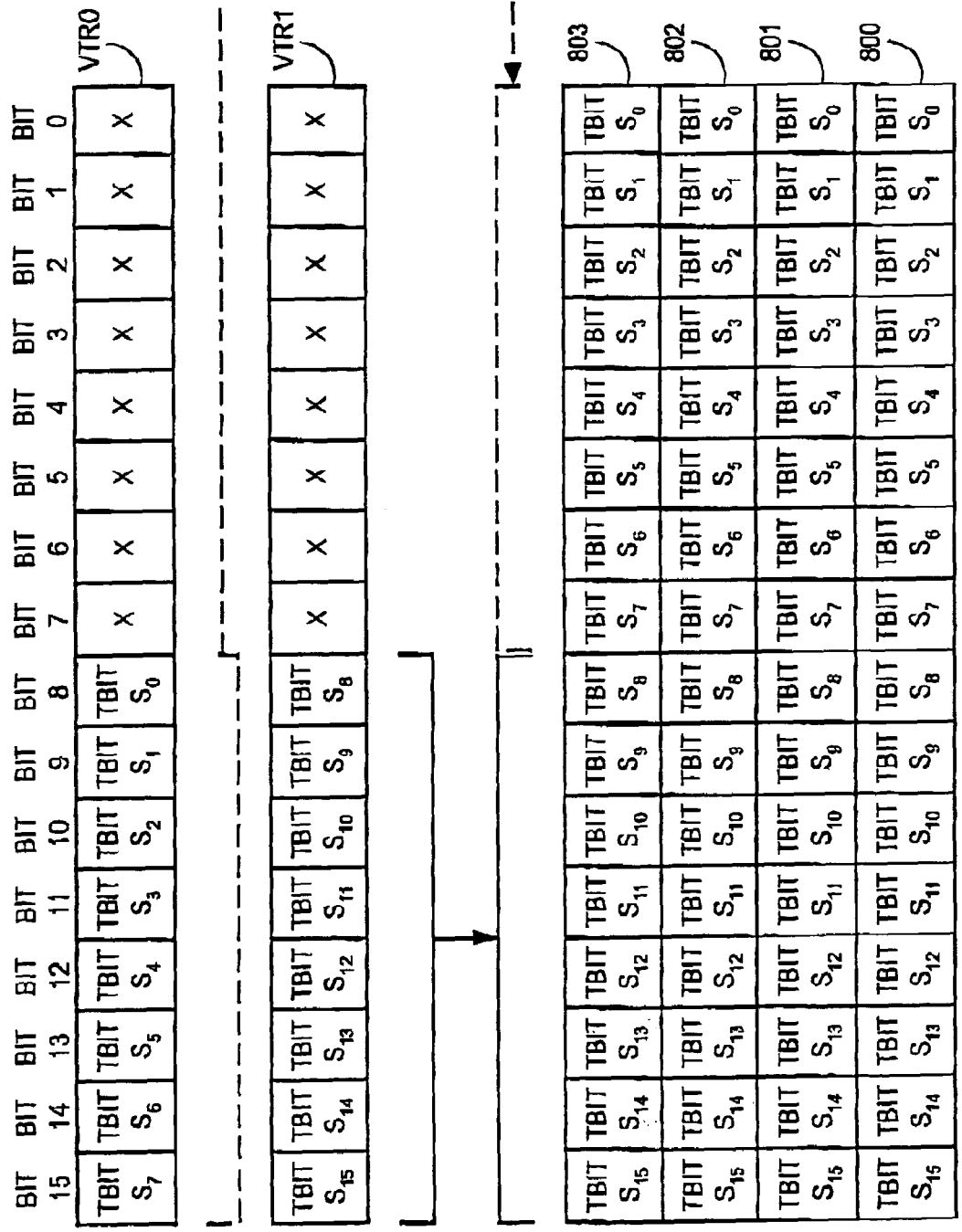
FIG. 8 is a schematic illustration of a technique for saving the trace bits of the registers of FIG. 5 to memory cells having a length of at least 16 bits, according to a preferred embodiment of the present invention.

Reference is now made to FIG. 8, which is a schematic illustration of a technique for saving the trace bits of registers VTR0 and VTR1 of FIG. 5 to memory cells having a length of at least 16 bits, according to a preferred embodiment of the present invention. Memory cells 800, 801, 802 and 803 are part of a memory unit (not shown) in which the trace bits for all the states for all of the stages are saved, one memory cell per stage. The trace bits for the stages are saved in the chronological order of the stages, with memory cell 800 containing trace bits for the earliest stage shown, and memory cell 803 containing trace bits for the most recent stage.

Registers VTR0 and VTR1 are packed to form a 16-bit value, which is saved to memory cell 803, so that memory cell 803 contains the trace bits for states $S_0$ through $S_{15}$ sequentially. The trace bits for $S_0$ to $S_7$ are saved in bits 0 to 7, respectively, of memory cell 803, and the trace bits for $S_8$ to $S_{15}$ are saved in bits 8 to 15, respectively.

FIG. 8 shows the memory cells 800–803 as being adjacent one after the other, which is the simplest arrangement. It will be appreciated that other arrangements of memory cells in the memory unit are possible. For example, the trace bits may be stored in every other memory cells in the memory unit, thereby leaving "empty" memory cells in between the rows of trace bits. In another example, if the memory unit is filled before all of the transmitted symbols have been received, then the memory cells can be reused in cyclic fashion.

It will be appreciated by persons skilled in the art that the "pack and save" technique shown in FIG. 8 is suitable for use when trace bits for 16-state binary convolution codes are stored in two 8-bit registers VTR0 and VTR1. The trace bits for $S_0$ to $S_7$ are stored sequentially in VTR0, and the trace bits for $S_8$ to $S_{15}$ is are stored sequentially in VTR1. 8-bit registers VTR0 and VTR1 are packed to form a 16-bit value, which is saved to a memory cell of length at least 16 bits.

It will also be appreciated by persons skilled in the art that the "pack and save" technique shown in FIG. 8 can be suitable for use when there are 32 states. The conditions are: a) half of a 32-bit register VTR0 (or all of a 16-bit register VTR0) stores the trace bits for states $S_0$ through $S_{15}$ sequentially, b) half of a 32-bit register VTR1 (or all of a 16-bit register VTR1) stores the trace bits for states $S_{16}$ through $S_{31}$ sequentially, and c) the memory cells are of length at least 32 bits. Similar conditions for binary convolution codes having more than 32 states are easily determined.

Reference is now made to FIG. 9, which is a schematic illustration of an arrangement of trace bits for 32-state binary convolution codes (i.e. a constraint length K of 6) in two 16-bit registers, referenced VTR0 and VTR1, according to another preferred embodiment of the present invention. The trace bits for $S_0$ through $S_{15}$ are stored sequentially in register VTR0, and the trace bits for $S_{16}$ through $S_{31}$ are stored sequentially in register VTR1. Registers VTR0 and VTR1 are filled by calculating trace bits one butterfly at a time, shifting registers VTR0 and VTR1 and storing the newly calculated trace bits in the highest bits of the registers, as described hereinabove with respect to FIG. 5. The hardware component architectures described hereinabove with respect to FIGS. 6 and 7 are applicable in this case as well.

It will be appreciated by persons skilled in the art that the "half in VTR0 and half in VTR1" arrangement shown in FIG. 9 can be easily modified to accommodate the case of trace bits for $2^{K-1}$-state binary convolution codes which are stored in two registers VTR0 and VTR1 of length $2^{K-2}$.

Figure 10:
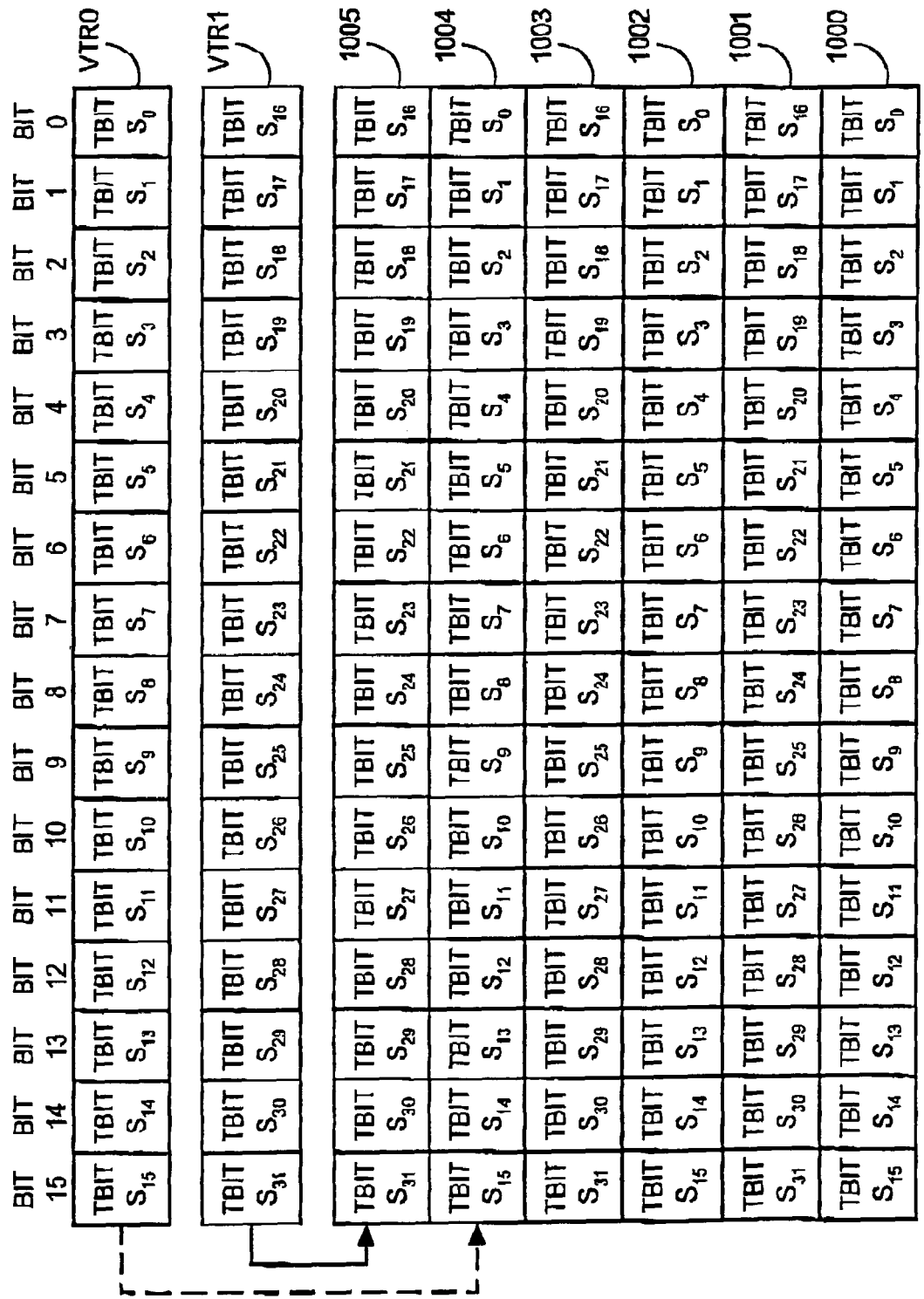
FIG. 10 is a schematic illustration of a technique for saving the trace bits of the registers of FIG. 9 to memory cells having a length of at least 16 bits, according to a preferred embodiment of the present invention.

Reference is now made to FIG. 10, which is a schematic illustration of a technique for saving the trace bits of registers VTR0 and VTR1 of FIG. 9 to memory cells of length at least 16 bits, according to a preferred embodiment of the present invention. Memory cells 1000–1005 are part of a memory unit (not shown) in which the trace bits for all the states for all of the stages are saved, in groups of two memory cells per stage. The trace bits for the stages are saved in the chronological order of the stages, with the group of memory cells 1000 and 1001 containing trace bits for the earliest stage shown, and the group of memory cells 1004 and 1005 containing trace bits for the most recent stage.

Register VTR0 is saved to memory cell 1004, so that memory cell 1004 contains the trace bits for states $S_0$ through $S_{15}$ sequentially. Register VTR1 is saved to memory cell 1005, so that memory cell 1005 contains the trace bits for states $S_{16}$ to $S_{31}$ sequentially. In an alternative preferred embodiment, register VTR1 is saved to memory cell 1004, so that memory cell 1004 contains the trace bits for states $S_{16}$ to $S_{31}$, and register VTR0 is saved to memory cell 1005, so that memory cell 1005 contains the trace bits for states $S_0$ through $S_{15}$ sequentially.

It will be appreciated by persons skilled in the art that the "two memory cells per stage" arrangement shown in FIG. 10 can be easily modified to accommodate the case of 16-state binary convolution codes whose trace bits are stored in groups of two 8-bit memory cells per stage. Similarly the arrangement can be easily modified to accommodate the case of 64-state binary convolution codes whose trace bits are stored in groups of two 32-bit memory cells per stage.

Figure 11:
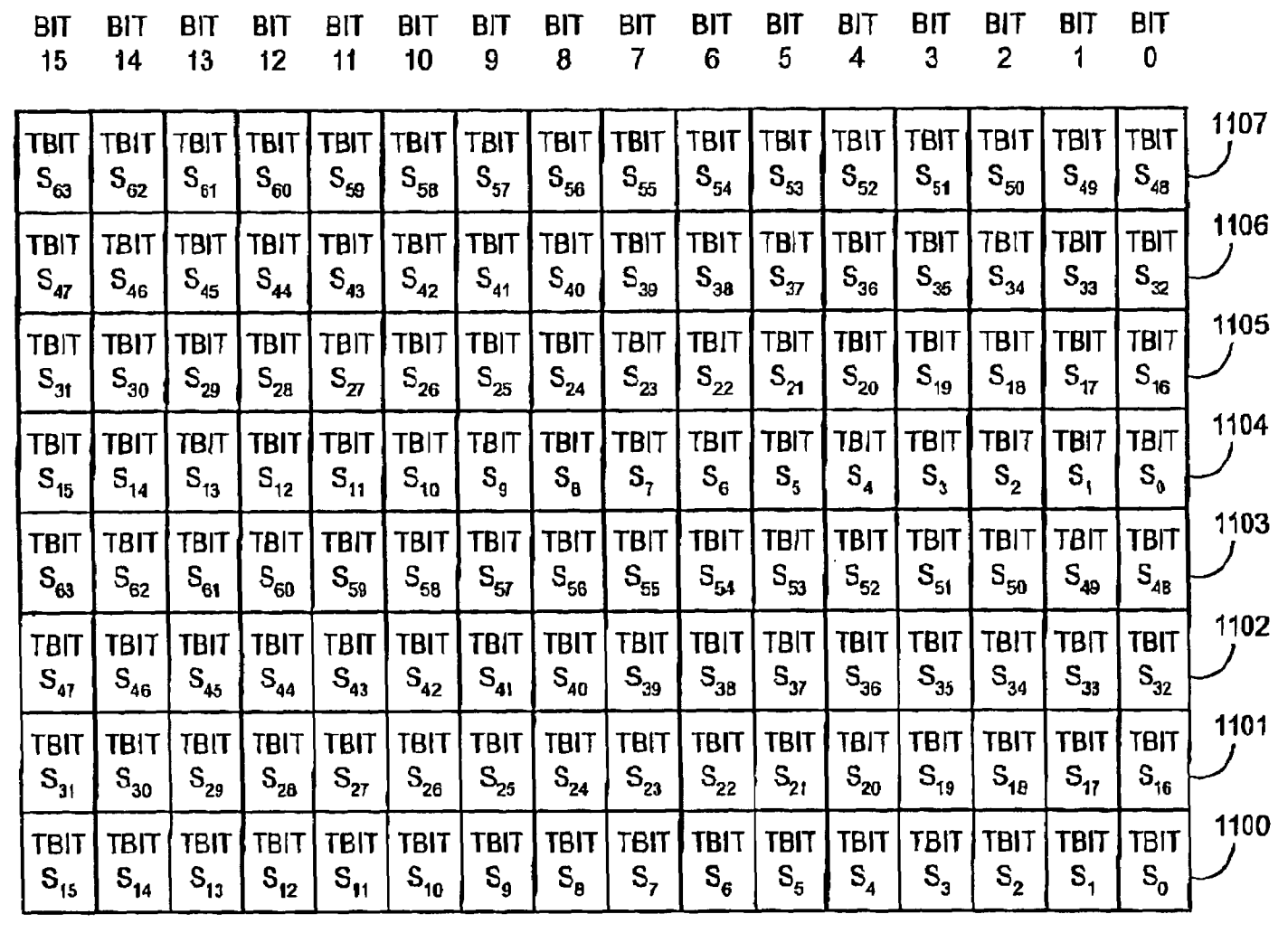

Reference is now made to FIG. 11, which is a schematic illustration of 16-bit memory cells containing two stages of trace bits for 64-state binary convolution codes, each stage occupying a group of four 16-bit memory cells, according to a preferred embodiment of the present invention. The trace bits for states $S_0$ through $S_{15}$ are stored in VTR0 and the trace bits for states $S_{32}$ through $S_{47}$ are stored in VTR1. The trace bits for states $S_0$ through $S_{15}$ are then saved to memory cell 1104, and the trace bits for states $S_{32}$ through $S_{47}$ are saved to memory cell 1106. Then the trace bits for states $S_{16}$ through $S_{31}$ are stored in VTR0 and the trace bits for states $S_{48}$ through $S_{63}$ are stored in VTR1. The trace bits for states $S_{16}$ through $S_{31}$ are then saved to memory cell 1105, which is between memory cells 1104 and 1106, and the trace bits for states $S_{48}$ through $S_{63}$ are saved to memory cell 1107 which is adjacent to memory cell 1106. The group of memory cells 1104, 1105, 1106 and 1107 is adjacent to the group of memory cells 1100, 1101, 1102 and 1103, which contain the trace bits for the previous stage.

Figure 12:
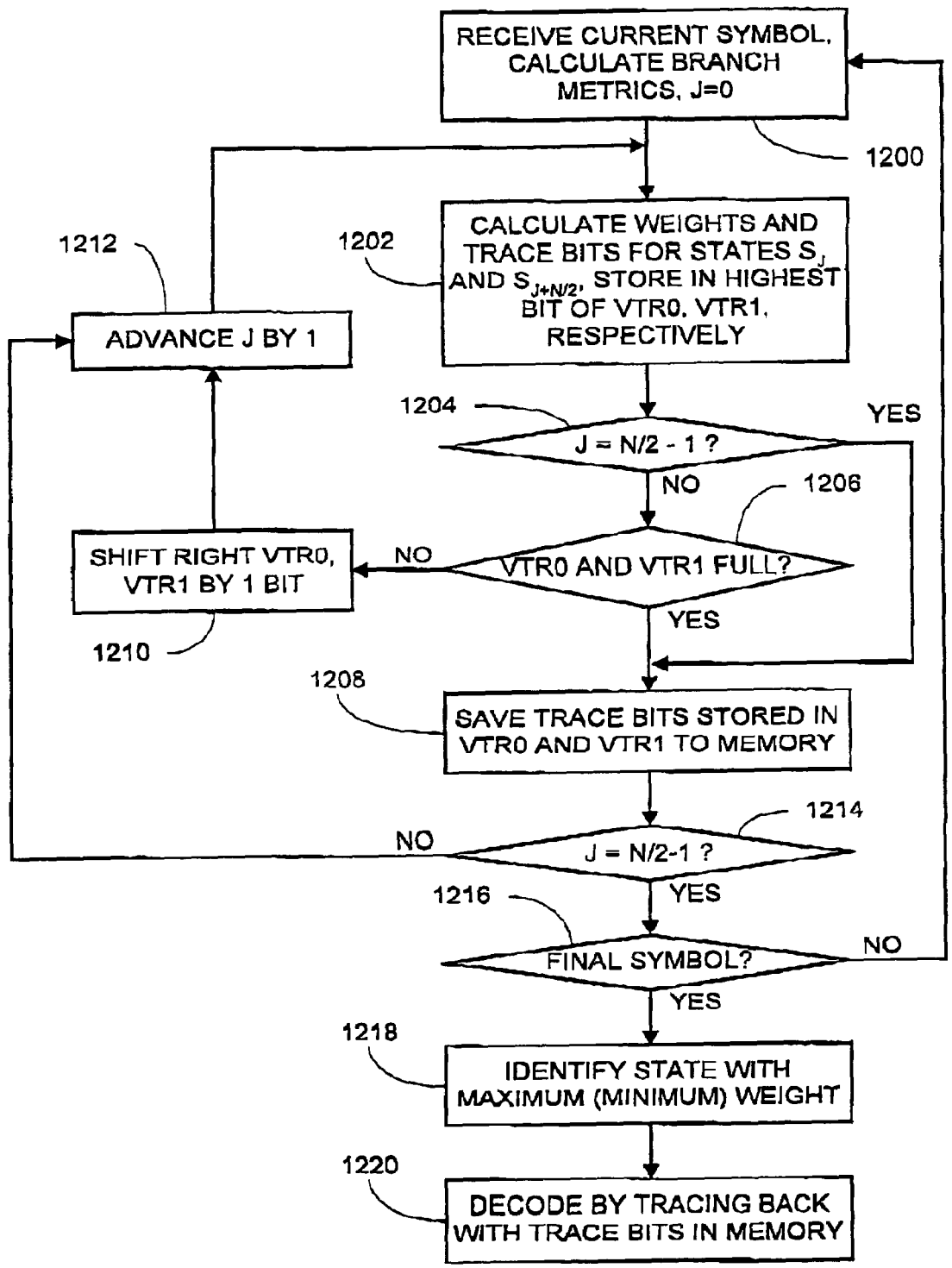
FIG. 12 is a flowchart illustration of a method for decoding, according to a preferred embodiment of the present invention.

Reference is now made to FIG. 12, which is a flowchart illustration of a method for decoding, according to a preferred embodiment of the present invention. A current symbol is received, branch metrics of all possible transitions in the new stage are calculated, and state index J is set to zero (step 1200). For each butterfly (two ACS operations), two new weights of states $S_J$ and $S_{J+N/2}$ are calculated along with the corresponding trace bits, and the trace bits are stored in the highest bit of registers VTR0 and VTR1, respectively (step 1202). If state index J is equal to N/2−1 (checked in step 1204), indicating that trace bits for all states in the current stage have been calculated, then the trace bits stored in registers VTR0 and VTR1 are saved to memory (step 1208). If state index J is not equal to N/2−1, then it is checked whether registers VTR0 and VTR1 are full (step 1206). The check of step 1204 needs to be performed before the check of step 1206 for the case that the number of states N is equal to or smaller than the length of registers VTR0 and VTR1. If registers VTR0 and VTR1 are full, then the trace bits stored in registers VTR0 and VTR1 are saved to memory (step 1208). If registers VTR0 and VTR1 are not full, then they are each shifted 1 bit to the right (step 1210), state index J is advanced by 1 (step 1212), and the method continues from step 1202.

After the trace bits stored in registers VTR0 and VTR1 are saved to memory (step 1208), it is checked again whether state index J is equal to N/2−1 (step 1214). If state index J is not equal to N/2−1, which occurs at least once if the number of states N is more than twice the length of registers VTR0 and is VTR1, then the method continues from step 1212. If state index J is equal to N/2−1, indicating that trace bits for all states in the current stage have been calculated, then it is checked whether the current symbol is the final symbol (step 1216). If there are more symbols to be received, then the method continues from step 1200. Otherwise, the state with the maximum weight (or minimum weight, according to the alternative framework mentioned hereinabove) is identified (step 1218), and the trace bits in memory are used to trace back decode to find the optimal path to the original state (step 1220).

Figure 13:
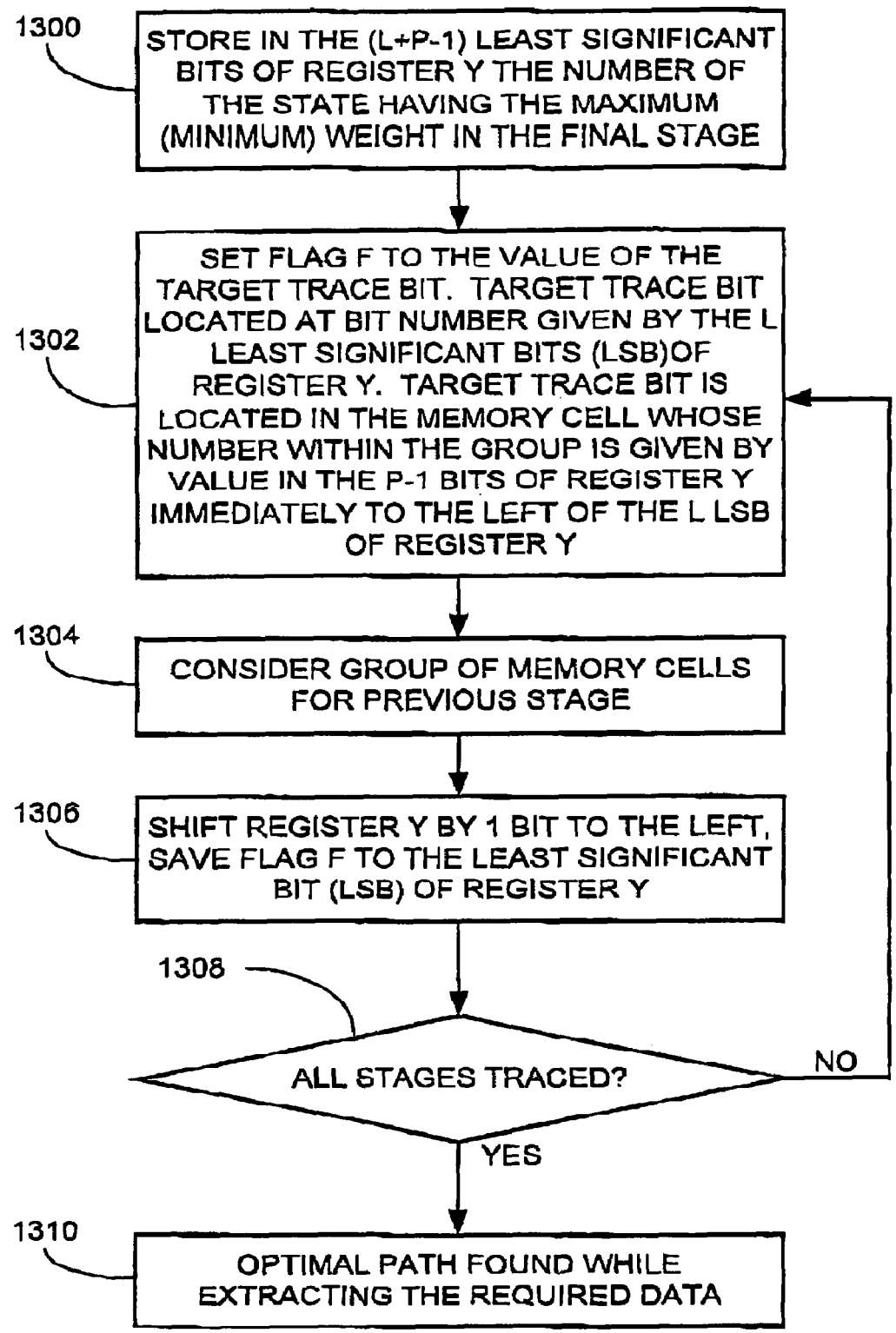
FIG. 13 is a flowchart illustration of a method for the trace back decoding step of the method of FIG. 12, according to a preferred embodiment of the present invention.

Reference is now made to FIGS. 13, 14, 15A, 15B, 15C and 15D. FIG. 13 is a flowchart illustration of a method for the trace back decoding step of the method of FIG. 12, according to a preferred embodiment of the present invention. FIG. 14 is an arrangement of exemplary trace bits in 16-bit memory cells for a 16-state binary convolution decoder, according to a preferred embodiment of the present invention. The memory cells are filled with trace bits, but in order to simplify FIG. 14, only those trace bits that are essential to the trace back procedure when finding the optimal path are shown. FIGS. 15A, 15B, 15C and 15D are schematic illustrations of the register Y and the flag F referred to by the method of FIG. 13, demonstrating the trace back decoding of the exemplary trace bits of FIG. 14, according to a preferred embodiment of the present invention.

The trace back method of FIG. 13 begins with the initial step of storing a value in the L+(P−1) least significant bits (LSB) of a register Y (shown in FIGS. 15A–15D). L is related to the "length" of the memory cell as follows: the length of the memory cell in bits can be expressed as a number between $2^{Q-1}$ and $2^Q-1$, for some Q; L has the value Q. In arithmetic terms, L is the integer part of the logarithm to base 2 of the length of the memory cell, expressed as follows;

$$L = int(\log_2(\text{length of the memory cell})).$$

In the examples given in FIGS. 14 and 15A–15D, L has the value 4. P is the number of memory cells in each group, which are used to store all the trace bits of a particular stage. In the examples given in FIGS. 14 and 15A–15D, P has the value 1.

The value stored in the L+(P−1) least significant bits (LSB) of a register Y is the number of the state having the maximum weight (or minimum weight, according to the alternative framework mentioned hereinabove) in the final stage (step 1300). In the example of FIG. 14, the state of the final stage having the maximum weight is $S_6$, and therefore FIG. 15A shows the number "6", expressed in binary as "0110", stored in register Y.

A flag F (shown in FIGS. 15A–15D) is set to the value of the target trace bit. The target trace bit is located at the bit number given by the L LSB of register Y. The target trace bit is located in the memory cell whose number within the group is given by value in the P−1 bits of register Y that are immediately to the left of the L LSB of register Y (step 1302).

In the example of FIG. 14, memory cell 1403 is the $0^{th}$ memory cell for the final stage, and the trace bit for $S_5$ is 0. FIG. 15A shows the value of the trace bit, 0, stored in flag F.

The group of memory cells for the previous stage is considered (step 1302). In the example of FIG. 14, memory cell 1402 has the trace bits for the stage previous to the final stage. Register Y is shifted 1 bit to the left, and the contents of flag F are saved to the least significant bit of register Y (step 1306). FIG. 15B shows the 4 LSB of register Y, "1100", after step 1306.

Then it is checked whether all stages have been traced (step 1308). If the trace back is not complete, then the method continues from step 1302. If the trace back is complete, then the optimal path has been found (step 1310). In the present example, not all stages have been traced, and the method continues from step 1302. In the example of FIG. 14, the 4 LSB of register Y are "1100", and flag F is set to the value of the trace bit for $S_{12}$ in memory cell 1402, which is 1. FIG. 15B shows the value of the trace bit, 1, stored in flag F.

The memory cell 1401 is then considered. Then register Y is shifted 1 bit to the left, and the contents of flag F are saved to the least significant bit of register Y. FIG. 15C shows the 4 LSB of register Y, "1001", after the repetition of step 1306. The trace back is not complete, and the method continues from step 1302. In the example of FIG. 14, the 4 LSB of register Y are "1001", and flag F is set to the value of the trace bit for $S_9$ in memory cell 1401, which is 0. FIG. 15C shows the value of the trace bit, 0, stored in flag F.

The memory cell 1400 is then considered. Then register Y is shifted 1 bit to the left, and the contents of flag F are saved to the least significant bit of register Y. FIG. 15D shows the 4 LSB of register Y, "0010", after the repetition of step 1306. Bit 2 of memory cell 1400 is therefore the bit whose trace bit needs to be considered in the next loop of steps 1302–1306. FIG. 15D shows the value of the trace bit, 0, stored in flag F.

As is known in the art, steps 1302 and 1304 can be combined in a single cycle. Therefore, for the case of trace bits of a 16-state binary convolution decoder (i.e. a constraint length K of 5) saved sequentially in memory cells of length at least 16 bits, the trace back can be performed in as few as two cycles. This is as opposed to the six cycles required by the prior art method. The second cycle is step 1306. This achievement of as few as two cycles is due to the sequential arrangement of the trace bits in registers VTR0 and VTR1 and subsequently in the memory cells, and due to the new instruction that combines steps 1302 and 1304. In fact, any time the group of memory cells which stores the trace bits for all states of a stage is one memory cell, the trace back can be performed in as few as two cycles.

It will be appreciated by persons skilled in the art that register Y may be a shift register, in which case flag F is stored directly to the least significant bit of register Y. Alternatively, register Y may be a simple output register, in which case a barrel shifter is placed as an intermediary between flag F and register Y.

Figures 16A, 16B, 16C:
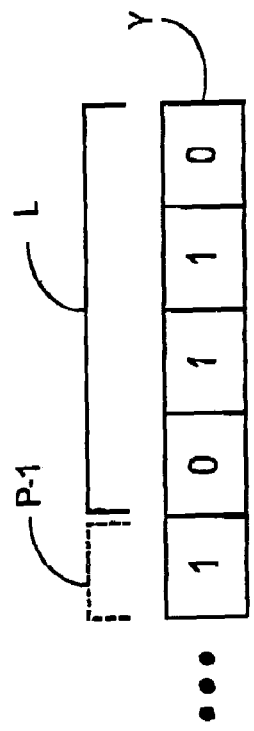

It will also be appreciated by persons skilled in the art that many modifications can be made to the method of FIG. 13 that are directed to alternative implementations and are within the scope of the present invention. Reference is now made to FIGS. 16A, 16B and 16C. FIG. 16A is a schematic illustration of 16-bit memory cells 1600 and 1601 containing trace bits for one stage of 32-state binary convolution codes. FIG. 16B is a schematic illustration of a 32-bit register Z to which the contents of memory cells 1600 and 1601 have been copied, so that the trace bits in register Z are ordered sequentially. FIG. 16C is a schematic illustration of the register Y containing trace back information.

The value of the bit in the P−1 bits immediately to the left of the L LSB of register Y is checked. In the present example, L is 4, P is 2, and the value of the bit is 1. Since the value of the bit is 1, the bit number given by the 4 LSB of register Y, "0110" or 6, refers to bit 22 of register Z, and not bit 6 of register Z. The register Z is shifted right 16 bits and the value of the trace bit at the bit number given by the 4 LSB of register Y is tested and saved to flag F (not shown).

It will be appreciated by persons skilled in the art that the present invention is not limited by what has been particularly shown and described herein above, rather the scope of the invention is defined by the claims that follow.

What is claimed is:

1. A binary convolution decoder having multiple stages, each stage having states of a binary convolution code, the decoder comprising:
    at least one arithmetic logic unit to determine trace bits for each of said states for each of said multiple stages;
    a first register and a second register to jointly store a single copy of trace bits of at least a portion of one stage;
    a storage device having memory cells, wherein for each of said multiple stages, a group of one or more memory cells is to store said trace bits in sequential order;
    means for tracing back, stage by stage, through said memory cells using said trace bits; and
    a trace back register whose L+P−1 least significant bits indicate the location in said group of a bit whose trace bit is to be saved into the least significant bit of the trace back register after the trace back register is shifted right one bit, said location comprising the bit number given by the L least significant bits of the trace back register and the memory cell whose number in said group is given by the value in the P−1 bits of the trace back register immediately to the left of said L least significant bits, where L is the integer part of the logarithm to base 2 of the length of the memory cell and P is the number of memory cells in said group.

2. A decoder according to claim 1, wherein said means for tracing back is to trace back in as few as two clock cycles per stage.

3. A decoder according to claim 1, wherein each of said stages has 16 states, each of said memory cells has a length of at least 16 bits and said means for tracing back is to trace back in as few as two clock cycles per stage.

4. A decoder according to claim 1, wherein each of said stages has 32 states, each of said memory cells has a length of at least 32 bits and said means for tracing back is to trace back in as few as two clock cycles per stage.

5. A method for Viterbi decoding of binary convolution codes, the decoding involving multiple stages each having states of a binary convolution code, the method comprising:
- determining trace bits for each of said states for each of said multiple stages;
- storing a single copy of trace bits of at least a portion of one stage jointly in a first register and a second register;
- for each of said multiple stages, storing said trace bits in sequential order in a group of one or more memory cells of a storage device such that the trace bits of at least three of said stages are simultaneously maintained by said storage device; and
- tracing back, stage by stage, through said memory cells using said trace bits, wherein tracing back through said memory cells comprises for each stage shifting a trace back register left one bit saving into the least significant bit of said trace back register the trace bit located in the memory cell whose number in said group is given by the value of the P−1 bits of said trace back register immediately to the left of the L least significant bits of said trace back register and located at the bit number given by said L least significant bits of said trace back register, where L is the integer part of the logarithm to base 2 of the length of the memory cell and P is the number of memory cells in said group.

6. A method according to claim 5, wherein tracing back through said memory cells is performed in as few as two clock cycles per stage.

7. A method according to claim 5, wherein each of said stages has 16 states, each of said memory cells has a length of at least 16 bits and tracing back through said memory cells is performed in as few as two clock cycles per stage.

8. A method according to claim 5, wherein each of said stages has 32 states, each of said memory cells has a length of at least 32 bits and tracing back through said memory cells is performed in as few as two clock cycles per stage.

9. A method comprising:
- tracing back, stage by stage, in as few as two clock cycles per stage, states of binary convolution codes that are decoded using Viterbi decoding, based on sequentially stored trace bits of two or more of said stages, wherein tracing back said states comprises
- in a first clock cycle, generating a generated B-bit binary representation having a least significant bit equal to a trace bit of a state of a particular stage and having (B−1) most significant bits equal to the (B−1) least significant bits of a B-bit binary representation of an index of said state, and identifying a trace bit of a state of a previous stage, where an index of said state of said previous stage is given by said generated B-bit binary representation; and
- in a second clock cycle, storing said trace bit of said state of said previous stage in a single bit of temporary storage, wherein B is the logarithm to base 2 of the number of states in a stage.

10. A method according to claim 9, further comprising:
- storing trace bits for states of a stage in a single memory cell having a length of at least the number of states in a stage,
- wherein identifying said trace bit of said state of said previous stage comprises generating from said generated B-bit binary representation an address of a bit of said single memory cell that comprises said trace bit of said state of said previous stage.

11. A method according to claim 10, wherein said trace bits are stored sequentially in said single memory cell and said address is said index of said state of said previous stage.

12. A method according to claim 9, wherein generating said generated B-bit binary representation comprises:
- multiplying B bits of a memory element by two to produce a product;
- adding the content of said single bit of temporary storage to said product to produce a sum; and
- storing the B least significant bits of said sum in said B bits of said memory element.

13. A method according to claim 12, further comprising:
- storing trace bits for states of a stage in two or more memory cells having a total number of bits at least the number of states in a stage,
- wherein identifying said trace bit of said state of said previous stage comprises generating from said generated B-bit binary representation an address of a bit of said memory cells that comprises said trace bit of said state of said previous stage.

14. A method according to claim 13, wherein generating said address comprises:
- addressing a particular memory cell by the content of the (P−1) most significant bits of said B bits of said memory element; and
- addressing a particular bit in said particular memory cell by the content of the L least significant bits of said B bits of said memory element,
- wherein L is the integer part of the logarithm to base 2 of the number of states stored in each of said memory cells, and P is the number of said memory cells.

15. A method to be used in Viterbi decoding of binary convolution codes, the decoding involving multiple stages each having states of a binary convolution code, the method comprising:
- generating a generated B-bit binary representation having a least significant bit equal to a trace bit of a state of a particular stage and having (B−1) most significant bits equal to the (B−1) least significant bits of a B-bit binary representation of an index of said state; and
- identifying a trace bit of a state of a previous stage, where an index of said state of said previous stage is given by said generated B-bit binary representation,
- wherein B is the logarithm to base 2 of the number of states in a stage.

16. A method according to claim 15, further comprising:
- storing said trace bit of said state of said previous stage in a single bit of temporary storage.

17. A method according to claim 16, wherein generating said B-bit binary representation comprises:
- multiplying B bits of a memory element by two to produce a product;
- adding the content of said single bit of temporary storage to said product to produce a sum; and
- storing the B least significant bits of said sum in said B bits of said memory element.

* * * * *